(12) United States Patent
Liu

(10) Patent No.: US 7,082,596 B2
(45) Date of Patent: **\*Jul. 25, 2006**

(54) SIMULATION-BASED SELECTION OF EVALUATION POINTS FOR MODEL-BASED OPTICAL PROXIMITY CORRECTION

(75) Inventor: Hua-Yu Liu, Palo Alto, CA (US)

(73) Assignee: Synopsys, Inc., Mountain View, CA (US)

(*) Notice: Subject to any disclaimer, the term of this patent is extended or adjusted under 35 U.S.C. 154(b) by 477 days.

This patent is subject to a terminal disclaimer.

(21) Appl. No.: 10/306,055

(22) Filed: Nov. 27, 2002

(65) Prior Publication Data

US 2004/0102945 A1   May 27, 2004

(51) Int. Cl.
*G06F 17/50* (2006.01)
(52) U.S. Cl. .......................................... 716/19
(58) Field of Classification Search .................. 716/19
See application file for complete search history.

(56) References Cited

U.S. PATENT DOCUMENTS 6,453,457 B1 * 9/2002 Pierrat et al. .................. 716/19
6,574,784 B1 * 6/2003 Lippincott et al. ............. 716/8
6,584,609 B1 * 6/2003 Pierrat et al. .................. 716/19
6,763,514 B1 * 7/2004 Zhang ........................... 716/19

\* cited by examiner

*Primary Examiner*—Vuthe Siek
*Assistant Examiner*—Brandon Bowers
(74) *Attorney, Agent, or Firm*—Park, Vaughan & Fleming LLP; Edward J. Grundler

(57) ABSTRACT

One embodiment of the invention provides a system that uses simulation results to select evaluation points for a model-based optical proximity correction (OPC) operation. Upon receiving a layout, the system first selects critical segments in the layout, and then performs a dense simulation on the critical segments. This dense simulation identifies deviations (or low contrast) between a desired layout and a simulated layout at multiple evaluation points on each of the critical segments. Next, for each critical segment, the system selects an evaluation point from the multiple evaluation points on the critical segment based on results of the dense simulation. The system then performs a model-based OPC operation using the selected evaluation point for each critical segment.

27 Claims, 3 Drawing Sheets

SIMULATION-BASED SELECTION OF EVALUATION POINTS FOR MODEL-BASED OPTICAL PROXIMITY CORRECTION

BACKGROUND

1. Field of the Invention

The invention relates to the process of fabricating semiconductor chips. More specifically, the invention relates to a method and an apparatus for using results of a simulation to select evaluation points for use in a model-based optical proximity correction (OPC) operation.

2. Related Art

As integration densities on a semiconductor chips continue to increase at an exponential rate, it is becoming progressively harder to deal with optical effects that arise during the optical lithography process involved in manufacturing the semiconductor chips. These optical effects can cause unwanted distortions in the printed layout that is generated by the optical lithography process.

To remedy this problem, a layout is often subjected to a model-based optical proximity correction (OPC) operation, which adjusts the layout to compensate for optical effects. (Although the term "optical proximity correction" is used, more generally the term as used herein refers to correction for any specified proximity effects, e.g. optical, microloading, etch, resist, etc.) These adjustments are made based upon results of model-based simulations of the printed layout. During this OPC operation, edges in the layout are divided into segments, and each segment is adjusted with a negative or a positive bias based upon a deviation between the desired layout and the simulated layout at an "evaluation point," which is located within the segment.

The location of this evaluation point can be pre-determined through simple rules, such as by taking the mid-point of the segment, or by considering other factors, such as the shape of the feature to which the segment belongs. Unfortunately, these simple rules frequently do not select the optimal evaluation point for a given segment.

Even though the simulated layout may match the desired layout at a given evaluation point, environmental factors may cause the simulated layout to deviate significantly from the desired layout at other points on the segment. Note that this deviation will not be detected by taking measurements at the given evaluation point. Hence, the deviation will not be corrected during the model-based OPC process.

Hence, what is needed is a method and an apparatus that facilitates selecting optimal evaluation points for a model-based OPC process.

SUMMARY

One embodiment of the invention provides a system that uses simulation results to select evaluation points for a model-based optical proximity correction (OPC) operation. Upon receiving a layout, the system first selects critical segments in the layout, and then performs a dense simulation on the critical segments. This dense simulation identifies deviations (or low contrast) between a desired layout and a simulated layout at multiple evaluation points on each of the critical segments. Next, for each critical segment, the system selects an evaluation point from the multiple evaluation points on the critical segment based on results of the dense simulation. The system then performs a model-based OPC operation using the selected evaluation point for each critical segment.

In a variation on this embodiment, the system uses a predetermined rule to select the critical segments.

In a variation on this embodiment, the system additionally selects evaluation points for non-critical segments in the layout. (Non-critical segments are segments which are not selected as critical segments.) This selection is based upon a pre-determined rule that does not consider results of the dense simulation.

In a further variation, the system selects a location for an evaluation point for a given non-critical segment by selecting a pre-determined location on the given non-critical segment. Alternatively, the system can select a location for the evaluation point based on a shape of a feature to which the given non-critical segment belongs.

In a variation on this embodiment, for each critical segment, the system selects the evaluation point with the greatest deviation between the desired layout and the simulated layout.

In a variation on this embodiment, for each critical segment, the system selects the evaluation point with the greatest positive deviation or the greatest negative deviation between the desired layout and the simulated layout.

In a variation on this embodiment, the system selects more than one evaluation point for each critical segment. In this variation, the model-based OPC operation uses more than one evaluation point to adjust a bias for each segment. In other embodiments, such segments are subdivided with separate evaluation points for each of the segments.

DETAILED DESCRIPTION

Wafer Fabrication Process

Figure 1:
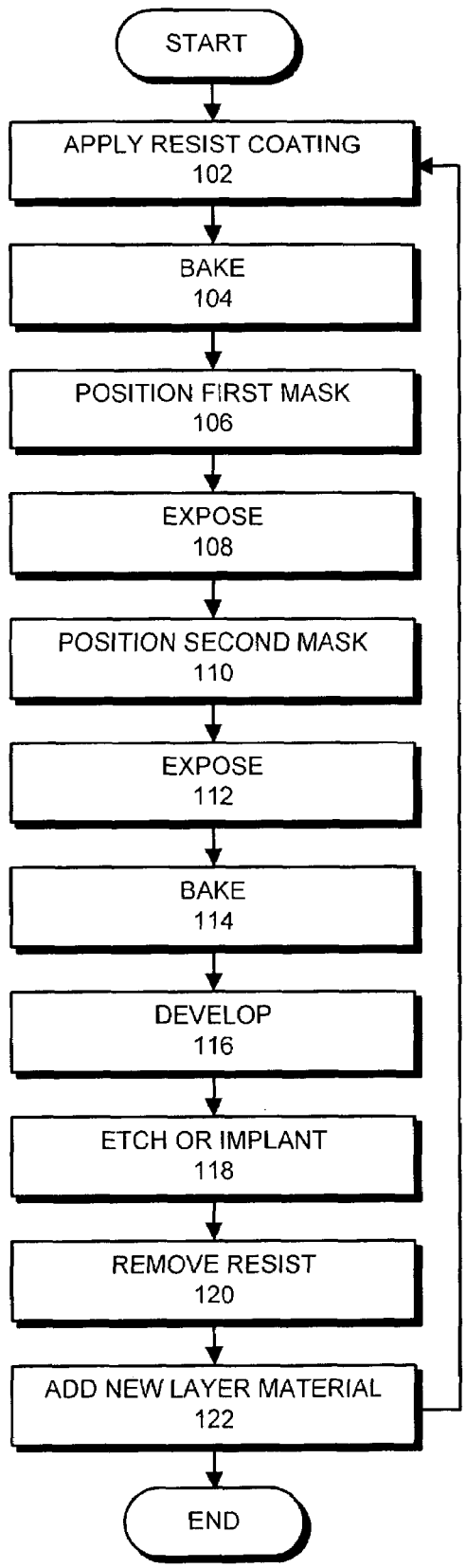
FIG. 1 presents a flow chart illustrating the wafer fabrication process in accordance with an embodiment of the invention.

FIG. 1 is a flow chart illustrating the wafer fabrication process in accordance with an embodiment of the invention. The system starts by applying a photoresist layer to the top surface of a wafer (step 102). Next, the system bakes the photoresist layer (step 104). The system then positions the first mask over the photoresist layer (step 106), and exposes the photoresist layer through the first mask (step 108). Next, the system positions the second mask over the photoresist layer (step 110), and then exposes the photoresist layer through the second mask (step 112). Steps 110 and 112 are optional for layers where only a single mask will be used to define the material in the layer. In one embodiment of the invention, the first mask is a PSM mask and the second mask is a trim mask. However, note that the first mask and/or the second mask can include phase shifting regions. Next, the system optionally bakes the wafer again (step 114) before developing the photoresist layer (step 116). Next, either a chemical etching or ion implantation step takes place (step 118) before the photoresist layer is removed (step 120). (Note that in the case of a lift-off process, a deposition can take place.) Finally, a new layer of material can be added and the process can be repeated for the new layer (step 122).

Mask Creation Process

Figure 2:
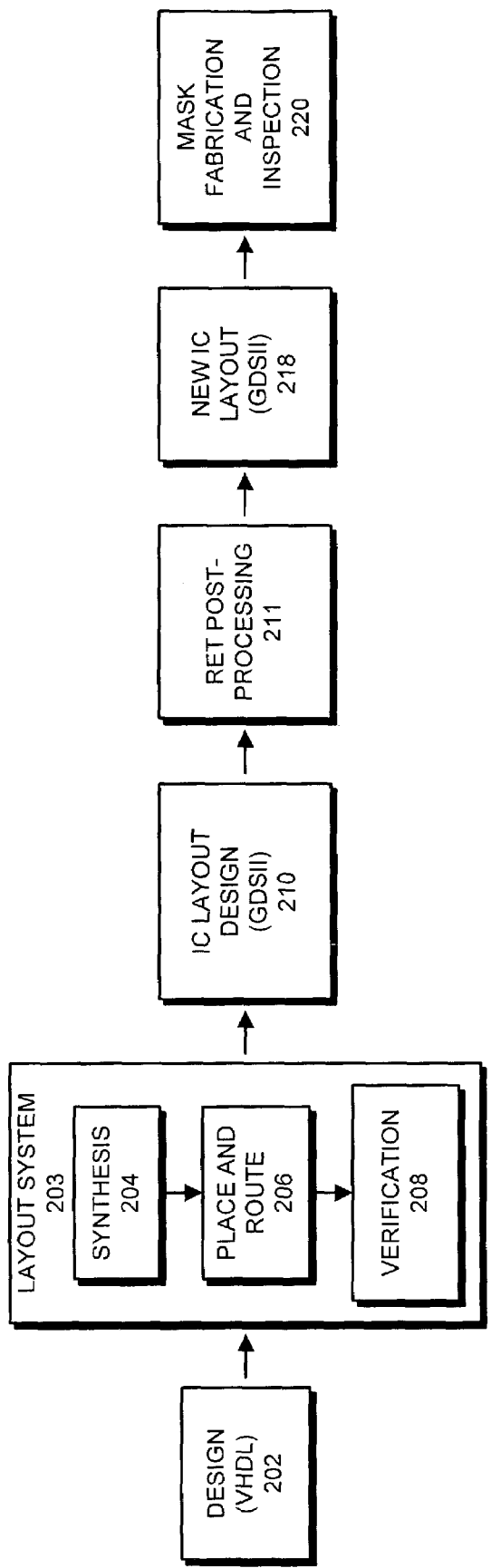
FIG. 2 illustrates the process of creating a mask to be used in fabricating an integrated circuit in accordance with an embodiment of the invention.

FIG. 2 illustrates the process of creating a mask to be used in the wafer fabrication process described above in accordance with an embodiment of the invention. The process starts when a circuit designer produces a design 202 in VHDL, or some other hardware description language. VHDL is an acronym for VHSIC Hardware Description Language. (VHSIC is a Department of Defense acronym that stands for very high-speed integrated circuits.) The VHDL standard has been codified in Institute for Electrical and Electronic Engineers (IEEE) standard 1076–1993.

Design 202 then feeds through a layout system 203 that performs a number of functions, such as synthesis 204, placement and routing 206 and verification 208. The result is an integrated circuit (IC) layout 210, which is in the form of a specification expressed in a format such as the hierarchical GDSII format.

IC layout 210 then passes into RET post-processing system 211, which can perform resolution enhancement techniques (RETs) to facilitate printing of the IC layout 210 on the finished wafer. Within RET post-processing system 211, the IC layout 210 can be processed for phase shifting (e.g. alternating aperture dark field phase shifting) as well as OPC to compensate for proximity effects that arise during the wafer production process. (Although the term "optical proximity correction" is used, more generally the term as used herein refers to correction for any specified proximity effects, e.g. optical, micro-loading, etch, resist, etc.)

The output of RET post-processing system 211 is a new IC layout 218. New IC layout 218 subsequently passes into mask fabrication and inspection processes 220.

Process of Selecting Evaluation Points

Figure 3:
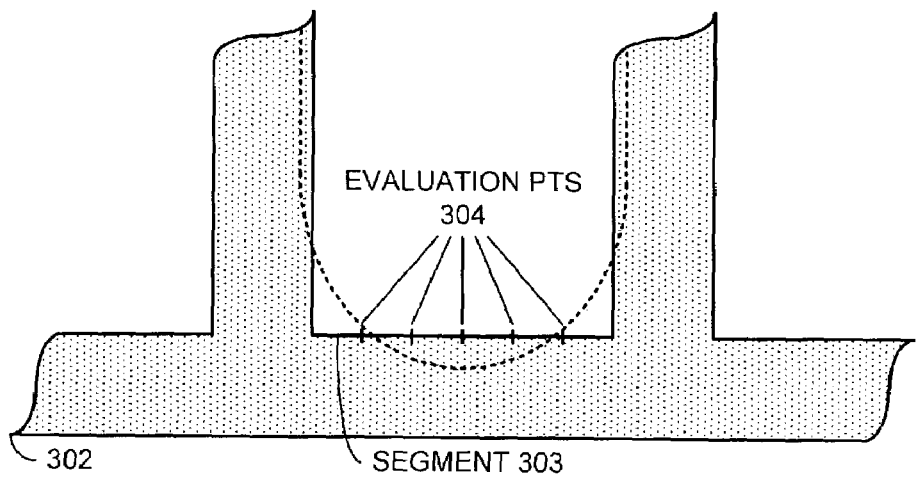
FIG. 3 illustrates an exemplary layout in accordance with an embodiment of the present invention.

FIG. 3 presents an exemplary layout that illustrates the process of selecting an evaluation point in accordance with an embodiment of the present invention. In this exemplary layout, a shape to be printed 302 includes a segment 303. In the standard OPC flow a single evaluation point from the set of evaluation points 304 would be chosen, e.g. pick the midpoint, etc. However, if the segment 303 is a critical segment (as identified by the user, selected by rules, etc.) then a dense simulation can be performed across segment 303 at a number of locations, shown here as a number of evaluation points 304. The actual simulation could be denser than shown in the figure, e.g. evaluation points every X nm along the segment.

In order to select one of these evaluation points, a model-based simulation is performed to compute the location of the segment at each of the evaluation points 304. For reference purposes here, a simulated printed image for segment 303 and two adjacent segments is indicated by the dashed line in FIG. 3. This simulated printed image shows the different amounts of deviation from the intended design across the whole segment and in particularly at different evaluation points in the set 304. One of the evaluation points 304 is then selected based on these deviations for use during a subsequent model-based OPC operation.

For example, the evaluation point with the largest positive deviation can be selected in some situations, and the evaluation point with the largest negative deviation can be selected in other situations. This ability to select between positive and negative deviations for different situations is useful because positive deviations can cause problems in some situations, for example causing bridging problems in dense regions. On the other hand, negative deviations can cause problems in other situations, for example causing breaks in thin lines that are not located in dense regions.

Although the discussion above is described in terms of having a set of evaluation points placed across a segment (e.g. the segment 303), the points need not actually be placed. For example, in one embodiment the iN-Tandem™ software from Numerical Technologies, Inc., is modified to support this approach to placing evaluation points. Such an embodiment might only place a single evaluation point for a segment after testing many "testing" points.

Figure 4:
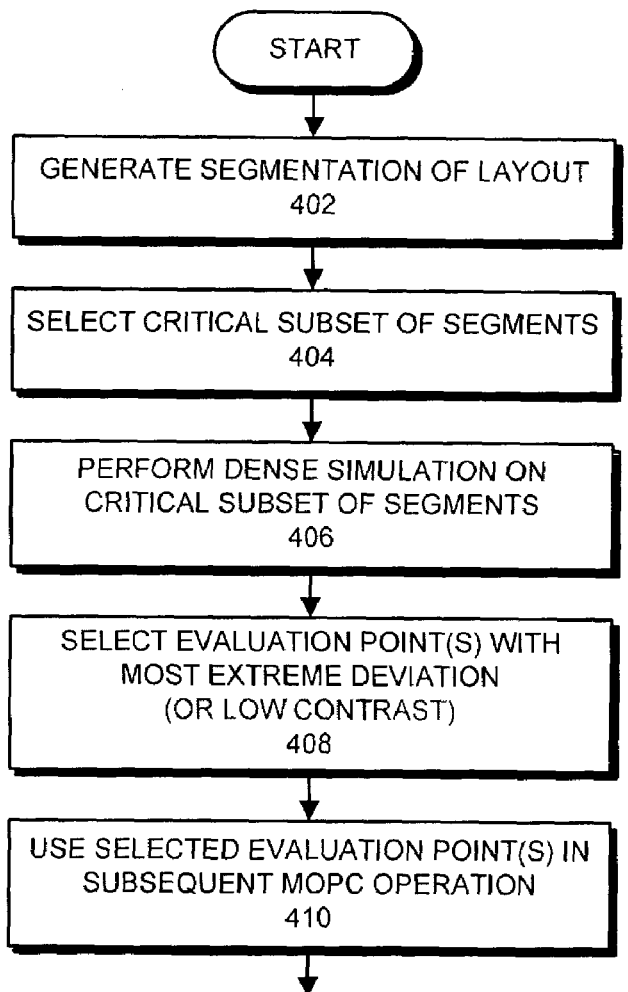
FIG. 4 presents a flow chart illustrating the process of selecting an evaluation point in accordance with an embodiment of the present invention.

FIG. 4 presents a flow chart illustrating the process of selecting an evaluation point in accordance with an embodiment of the present invention. This process starts after a segmentation (or dissection) of the layout has been generated (step 402). The system starts by selecting a critical subset of the segments based on one or more selection rules (step 404). For example, corner segments that generate curves in the printed layout can be selected. In another example, the system can perform a dense simulation and can select segments with the lowest contrast.

Next, the system performs a dense simulation on the critical segments, wherein the dense simulation considers multiple evaluation (or testing) points along each of the critical segments (step 406). The system subsequently uses results of this simulation to select at least one evaluation point for each of the critical segments (step 408) based on the deviation or contrast at each of the testing points from the intended layout. For example, the system can select the evaluation point with the largest deviation for each critical segment, or the system can select the evaluation point with the lowest contrast. The system then uses the selected evaluation point(s) in a subsequent model-based OPC operation (step 410). Note that evaluation points selected in this way are likely to produce a better result during the subsequent model-based OPC operation.

In some embodiments, the process of FIG. 4 is implemented in suitable versions of software such as the iN-Tandem™ proximity correction software from Numerical Technologies, Inc., San Jose, Calif. In such an embodiment, after dissection (step 402) occurs, the iN-Tandem software uses rules (e.g. of the types supported for hybrid OPC) to select the critical segments (step 404). Once the critical segments were selected, the dense simulation can be performed and the evaluation point chosen (steps 406 and 408). Finally, the existing M-OPC engine can operate on the layout with the selected evaluation points (step 410).

Additionally, although this invention is described primarily in the context of a model-based OPC operation, it is compatible with hybrid OPC operations, e.g. combinations of rule and model OPC. No changes would be necessary to the process of FIG. 4, except that the selected evaluation points would only be used in the context of the model-based operations of the hybrid OPC process.

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent.

Note that the invention can be applied to various types of lithographic process for fabricating semiconductor chips, including processes that make use of, deep-ultraviolet (DUV) radiation, extreme ultraviolet (EUV) radiation, X-rays, etc.

What is claimed is:

1. A method for using simulation results to select evaluation points for a model-based optical proximity correction (OPC) operation, comprising:
    selecting critical segments in the layout;
    performing a dense simulation on a given segment of the critical segments, wherein the dense simulation determines deviations between a desired layout and a simulated layout at multiple evaluation points on the given segment;
    for each critical segment, selecting an evaluation point from the multiple evaluation points on the critical segment based on results of the dense simulation; and
    performing a model-based OPC operation using the selected evaluation point for each critical segment.

2. The method of claim 1, wherein the dense simulation additionally determines whether portions of the critical segments in proximity to the multiple evaluation points have low contrast in the simulated layout.

3. The method of claim 1, wherein selecting the critical segments in the layout involves using a pre-determined rule to select the critical segments.

4. The method of claim 1, further comprising selecting evaluation points for non-critical segments in the layout, which are not critical segments, based upon a pre-determined rule that does not consider results of the dense simulation.

5. The method of claim 4, wherein the pre-determined rule selects an evaluation point for a given non-critical segment by:
    selecting the evaluation point at a pre-determined location on the given non-critical segment; or by
    selecting a location for the evaluation point based on a shape of a feature to which the given non-critical segment belongs.

6. The method of claim 1, wherein selecting the evaluation point for a given critical segment involves selecting the evaluation point with the greatest deviation between the desired layout and the simulated layout.

7. The method of claim 1, wherein selecting the evaluation point for a given critical segment involves using a pre-determined rule to determine whether to select the evaluation point with the greatest positive deviation or the greatest negative deviation between the desired layout and the simulated layout.

8. The method of claim 1,
    wherein selecting the evaluation point involves selecting more than one evaluation point for each critical segment; and
    wherein performing the model-based OPC operation involves using more than one evaluation point to adjust a bias for each segment during the model-based OPC process.

9. A computer-readable storage medium storing instructions that when executed by a computer cause the computer to perform a method for using simulation results to select evaluation points for a model-based optical proximity correction (OPC) operation, the method comprising:
    selecting critical segments in the layout;
    performing a dense simulation on a given segment of the critical segments, wherein the dense simulation determines deviations between a desired layout and a simulated layout at multiple evaluation points on the given segment;
    for each critical segment, selecting an evaluation point from the multiple evaluation points on the critical segment based on results of the dense simulation; and
    performing a model-based OPC operation using the selected evaluation point for each critical segment.

10. The computer-readable storage medium of claim 9, wherein the dense simulation additionally determines whether portions of the critical segments in proximity to the multiple evaluation points have low contrast in the simulated layout.

11. The computer-readable storage medium of claim 9, wherein selecting the critical segments in the layout involves using a pre-determined rule to select the critical segments.

12. The computer-readable storage medium of claim 9, wherein the method further comprises selecting evaluation points for non-critical segments in the layout, which are not critical segments, based upon a pre-determined rule that does not consider results of the dense simulation.

13. The computer-readable storage medium of claim 12, wherein the pre-determined rule selects an evaluation point for a given non-critical segment by:
    selecting the evaluation point at a pre-determined location on the given non-critical segment; or by
    selecting a location for the evaluation point based on a shape of a feature to which the given non-critical segment belongs.

14. The computer-readable storage medium of claim 9, wherein selecting the evaluation point for a given critical segment involves selecting the evaluation point with the greatest deviation between the desired layout and the simulated layout.

15. The computer-readable storage medium of claim 9, wherein selecting the evaluation point for a given critical segment involves using a pre-determined rule to determine whether to select the evaluation point with the greatest positive deviation or the greatest negative deviation between the desired layout and the simulated layout.

16. The computer-readable storage medium of claim 9,
    wherein selecting the evaluation point involves selecting more than one evaluation point for each critical segment; and
    wherein performing the model-based OPC operation involves using more than one evaluation point to adjust a bias for each segment during the model-based OPC process.

17. An apparatus that uses simulation results to select evaluation points for a model-based optical proximity correction (OPC) operation, comprising:
    a segment selection mechanism configured to select critical segments in the layout;
    a simulation mechanism configured to perform a dense simulation on a given segment of the critical segments, wherein the dense simulation determines deviations between a desired layout and a simulated layout at multiple evaluation points on the given segment;
    an evaluation point selection mechanism, wherein for each critical segment, the evaluation point selection mechanism is configured to select an evaluation point from the multiple evaluation points on the critical segment based on results of the dense simulation,; and
    a model-based OPC mechanism configured to perform a model-based OPC operation using the selected evaluation point for each critical segment.

18. The apparatus of claim 17, wherein the dense simulation additionally determines whether portions of the critical segments in proximity to the multiple evaluation points have low contrast in the simulated layout.

19. The apparatus of claim 17, wherein the segment selection mechanism is configured to use a pre-determined rule to select the critical segments.

20. The apparatus of claim 17, wherein the evaluation point selection mechanism is additionally configured to select evaluation points for non-critical segments in the layout, which are not critical segments, based upon a pre-determined rule that does not consider results of the dense simulation.

21. The apparatus of claim 20, wherein the pre-determined rule selects an evaluation point for a given non-critical segment by:
  selecting the evaluation point at a pre-determined location on the given non-critical segment; or by
  selecting a location for the evaluation point based on a shape of a feature to which the given non-critical segment belongs.

22. The apparatus of claim 17, wherein the evaluation point selection mechanism is configured to select the evaluation point with the greatest deviation between the desired layout and the simulated layout.

23. The apparatus of claim 17, wherein the evaluation point selection mechanism is configured to use a pre-determined rule to determine whether to select the evaluation point with the greatest positive deviation or the greatest negative deviation between the desired layout and the simulated layout.

24. The apparatus of claim 17,
  wherein the evaluation point selection mechanism is configured to select more than one evaluation point for each critical segment; and
  wherein the model-based OPC mechanism is configured to use more than one evaluation point to adjust a bias for each segment during the model-based OPC process.

25. A set of masks used to create an integrated circuit created through a process that uses simulation results to select evaluation points for a model-based optical proximity correction (OPC) operation, the process comprising:
  selecting critical segments in the layout;
  performing a dense simulation on a given segment of the critical segments, wherein the dense simulation determines deviations between a desired layout and a simulated layout at multiple evaluation points on the given segment;
  for each critical segment, selecting an evaluation point from the multiple evaluation points on the critical segment based on results of the dense simulation; and
  performing a model-based OPC operation using the selected evaluation point for each critical segment.

26. A set of masks for use in a semiconductor fabrication process, wherein masks in the set of masks are created through a process that uses simulation results to select evaluation points for performing a model-based optical proximity correction (OPC) operation on the layout, comprising:
  selecting critical segments in the layout;
  performing a dense simulation on a given segment of the critical segments, wherein the dense simulation determines deviations between a desired layout and a simulated layout at multiple evaluation points on the given segment;
  for each critical segment, selecting an evaluation point from the multiple evaluation points on the critical segment based on results of the dense simulation; and
  performing a model-based OPC operation using the selected evaluation point for each critical segment.

27. A means for using simulation results to select evaluation points for a model-based optical proximity correction (OPC) operation, comprising:
  a segment selection means for selecting critical segments in the layout;
  a simulation means for performing a dense simulation on a given segment of the critical segments, wherein the dense simulation determines deviations between a desired layout and a simulated layout at multiple evaluation points on the given segment;
  an evaluation point selection means that selects an evaluation point for each critical segment from the multiple evaluation points on the critical segment based on results of the dense simulation; and
  a model-based OPC mechanism for performing a model-based OPC operation using the selected evaluation point for each critical segment.

* * * * *